US008579416B2

(12) United States Patent
Fujii et al.

(10) Patent No.: US 8,579,416 B2
(45) Date of Patent: Nov. 12, 2013

(54) DROPLET DISCHARGING HEAD, MANUFACTURING METHOD THEREOF, AND DROPLET DISCHARGING DEVICE

(75) Inventors: Masahiro Fujii, Shiojiri (JP); Akira Sano, Matsumoto (JP)

(73) Assignee: Seiko Epson Corporation (JP)

( * ) Notice: Subject to any disclaimer, the term of this patent is extended or adjusted under 35 U.S.C. 154(b) by 294 days.

(21) Appl. No.: 12/770,053

(22) Filed: Apr. 29, 2010

(65) Prior Publication Data

US 2010/0208008 A1 Aug. 19, 2010

Related U.S. Application Data

(62) Division of application No. 12/025,104, filed on Feb. 4, 2008, now Pat. No. 7,798,615.

(30) Foreign Application Priority Data

Feb. 21, 2007 (JP) ................................ 2007-040962

(51) Int. Cl.
*B41J 2/045* (2006.01)
*H01L 41/22* (2013.01)

(52) U.S. Cl.
USPC ........................................... 347/70; 29/25.35

(58) Field of Classification Search
USPC ..................................................... 347/70, 71
See application file for complete search history.

(56) References Cited

U.S. PATENT DOCUMENTS 5,992,978 A 11/1999 Fujii et al.
6,213,590 B1 4/2001 Fujii et al.
6,332,669 B1 12/2001 Kato et al.
6,371,598 B1 4/2002 Fujii et al.
6,863,382 B2 * 3/2005 Anagnostopoulos et al. .. 347/70
7,261,862 B2 8/2007 Noritake et al.
7,438,395 B2 10/2008 Sugahara
7,497,557 B2 3/2009 Sugahara
2005/0212868 A1 * 9/2005 Radominski et al. ........... 347/72
2006/0139409 A1 * 6/2006 Matsushita et al. ............. 347/55
2008/0231666 A1 9/2008 Sugahara

FOREIGN PATENT DOCUMENTS

JP 08-058089 3/1996
JP 11-115179 4/1999
JP 11-320873 11/1999
JP 2001-071487 3/2001
JP 2001-253072 9/2001
JP 2001-334663 12/2001
JP 2001334663 A * 12/2001
JP 2003-75305 3/2003
JP 2003072065 A * 3/2003
JP 2004-098310 4/2004
JP 2005-246122 9/2005
JP 2006-116954 5/2006
JP 2006-272574 10/2006

* cited by examiner

*Primary Examiner* — Lisa M Solomon
(74) *Attorney, Agent, or Firm* — Harness, Dickey & Pierce, P.L.C.

(57) ABSTRACT

A droplet discharging head, includes: a discharging chamber; a plurality of nozzle orifices discharging droplets and each of the plurality of nozzle orifices is communicated with the discharging chamber; an actuator; a vibrating plate provided using a bottom wall of the discharging chamber and displaceably driven by the actuator; and a reservoir commonly communicated with each discharging chamber. The discharging chamber, the actuator, and the reservoir are each segmented on separate planes and stacked in this order in a manner that a projection plane in a direction perpendicular to a formation plane of the reservoir is contained in formation planes of the actuator and the discharging chamber.

13 Claims, 7 Drawing Sheets

DROPLET DISCHARGING HEAD, MANUFACTURING METHOD THEREOF, AND DROPLET DISCHARGING DEVICE

CROSS-REFERENCE TO RELATED APPLICATIONS

This application is a divisional of U.S. patent application Ser. No. 12/025,104 filed on Feb. 4, 2008. This application claims the benefit of Japanese Patent Application No. 2007-040962 filed Feb. 21, 2007. The disclosures of the above applications are incorporated herein by reference.

BACKGROUND

1. Technical Field

The present invention relates to a droplet discharging head used as an inkjet head or the like, a manufacturing method thereof, and a droplet discharging device.

2. Related Art

As a droplet discharging head used to discharge droplets, an inkjet head mounted on an apparatus such as an inkjet recording apparatus is known. Generally, an inkjet head is equipped with a nozzle substrate containing a plurality of nozzle orifices that discharge ink droplets, a discharging chamber that is joined to this nozzle substrate and communicated with the nozzle orifices, and a cavity substrate containing an ink flow passage having, e.g., a reservoir. The inkjet head is structured in a manner that ink droplets are discharged from selected nozzle orifices by applying pressure to the discharging chamber using a driver and displacing a vibrating plate. The system of driving is, for example, an electrostatic drive system using electrostatic force, a piezoelectric drive system using a piezoelectric element, or a system using a heating element.

Miniaturization of such an inkjet head has been progressing. For example, JP-A-8-58089, which employs the piezoelectric drive system, discloses a laminate structure including an actuator, an ink-pressurizing chamber (discharging chamber), and a common ink chamber (reservoir) that are segmented on separate planes.

Another example is JP-A-2001-334663, which discloses an inkjet head including an actuator and an ink-pressurizing chamber provided in segments on different planes and a common ink chamber arranged perpendicular to these actuator and ink-pressurizing chamber.

Also, JP-A-2001-253072 and JP-A-2006-272574 disclose an edge-ejecting or face-ejecting system inkjet head that includes an actuator, an ink-pressurizing chamber, and a common ink chamber stacked on top of each other.

However, in accordance with these inkjet heads of the related art, what is now desired is a recording apparatus that can meet demands for higher recording density for finer printing and faster recording.

For this purpose, it is necessary to increase arrangement density of elements such as the ink flow passage and the actuator. Moreover, with further miniaturization of the head, it is required to further downsize the recording apparatus so as to enhance portability and freedom of installation.

To downsize the inkjet head along with the miniaturization of the ink flow passage and the actuator, it is required to shrink the area of portions for the common ink chamber, wiring, integrated circuit (IC) packaging, and the like that occupies a large area of the segments in the inkjet head.

To shrink the area for wiring and IC packaging, high-density packaging is generally performed. However, there are limitations in carrying out the wiring and IC packaging on the same plane as the plane for forming the actuator.

Also, when the common ink chamber is merely downsized, a problem occurs that the head loss increases in the common ink chamber during supply of ink because of the increase in the flow passage resistance in the common ink chamber, and that this may disturb stable and uniform discharge of ink droplets from the nozzles. Further, the miniaturization of the common ink chamber may cause a problem that the compliance of the common ink chamber decreases. This generates pressure interference among the nozzles via the common ink chamber, thereby disturbing stable and uniform discharge of ink droplets from the nozzles.

SUMMARY

An advantage of the invention is to provide a droplet discharging head that is readily downsized, highly densely made, and has a greater number of nozzles, a method for manufacturing such a head, and a droplet discharging device that allows downsizing of an apparatus equipped with the droplet discharging head and that allows delivery of highly-fine droplets in high quality with a good response to high-speed driving.

According to a first aspect of the invention, a droplet discharging head includes: a discharging chamber; a plurality of nozzle orifices discharging droplets and each of the plurality of nozzle orifices is communicated with the discharging chamber; an actuator; a vibrating plate provided using a bottom wall of the discharging chamber and displaceably driven by the actuator; and a reservoir commonly communicated with each discharging chamber. The discharging chamber, the actuator, and the reservoir are each segmented on separate planes and stacked in this order in a manner that a projection plane in a direction perpendicular to a formation plane of the reservoir is contained in formation planes of the actuator and the discharging chamber.

Because it is possible to prevent the droplet discharging head in the laminate structure from stretching in a longitudinal direction of the substrate, the droplet discharging head can be downsized, highly densely made, and have a greater number of nozzles.

It is preferable that the actuator be provided on the actuator formation plane of a first substrate and the reservoir be provided on a plane of the first substrate, the plane opposing the actuator formation plane.

As a result, the same substrate is shared using the upper and lower surfaces thereof, in that the actuator can be provided on one of the surfaces, and the reservoir may be provided on the other surface.

It is preferable that the vibrating plate be equipped with a liquid material supply port communicated with each of the reservoir and the discharging chamber.

The liquid material reserved in the reservoir is supplied to each discharging chamber through the supply port provided to each vibrating plate. As a result, no bubble occurs in flowing paths.

In this aspect of the invention, the "liquid material" represents a material having a degree of viscosity to allow its delivery from the nozzle orifices. The liquid material may be aqueous or oil-based, provided that the liquid material has enough flowability (viscosity) to allow its delivery from the nozzle orifices and that it is a fluid as a whole whether or not it contains solids or dispersed solids.

It is preferable that a second substrate having the reservoir and the liquid material supply port be stacked on the plane opposing the actuator formation plane of the first substrate.

Instead of the first substrate having the actuator, the second substrate having the reservoir and the supply port for the liquid material may also be used. In this case, the second substrate is stacked on the plane remote from the actuator formation plane of the first substrate.

It is preferable that a bottom wall of the reservoir in the second substrate be a diaphragm.

By using the second substrate equipped with the reservoir and the supply port, the bottom wall of this reservoir may be formed as the diaphragm. Also, because the second substrate may be equipped with the liquid material supply port, a high-precision supply port may be provided.

It is preferable that an air chamber be provided at a side adjacent to one surface of the diaphragm, the one surface opposing the bottom wall. The air chamber allows deformation of the diaphragm. Also, there is an advantage that, because the diaphragm in thin film is incorporated, damages to the diaphragm may be prevented. The air chamber may be provided on either one of the first and second substrates. Naturally, the air chamber may be provided on both of the substrates.

It is preferable that the droplet discharging head further include a driver integrated circuit (IC) that is wired to the actuator and mounted on one of the actuator formation plane and the plane opposing the actuator formation plane of the first substrate.

As a result, the wiring and IC packaging area can be reduced, and this can contribute to miniaturization of the droplet discharging head itself.

It is preferable that the actuator be an electrostatic drive mechanism. The system for driving the actuator is not limited to any particular system. By using the electrostatic drive system, however, the droplet discharging head may be downsized even further.

According to a second aspect of the invention, a droplet discharging head includes: a nozzle substrate having a plurality of nozzle orifices discharging a liquid droplet; a cavity substrate including a discharging chamber segmentally provided thereon and communicated with each of plurality of the nozzle orifices, and a bottom wall serving as a vibrating plate; an electrode substrate having an individual electrode arranged on a first plane thereof so as to oppose the vibrating plate with a predetermined gap; and a reservoir commonly communicated with each discharging chamber and provided on a second plane of the electrode substrate, the second plane opposing the first plane.

The reservoir may be provided using the lower surface of the electrode substrate.

Alternatively, a reservoir substrate having the reservoir may be employed. According to a third aspect of the invention, a droplet discharging head includes: a nozzle substrate having a plurality of nozzle orifices discharging a liquid droplet; a cavity substrate including a discharging chamber segmentally provided thereon and communicated with each of the plurality of nozzle orifices, and a bottom wall serving as a vibrating plate; an electrode substrate having an individual electrode arranged on a first plane thereof so as to opposing the vibrating plate with a predetermined gap; and a reservoir substrate having a reservoir commonly communicated with each discharging chamber. The reservoir substrate is stacked on a second plane of the electrode substrate, the second plane opposing the first plane.

It is preferable that a driver integrated circuit (IC) that applies a drive voltage between the vibrating plate and the individual electrode be mounted on one of the first plane and the second plane of the electrode substrate.

According to a fourth aspect of the invention, a droplet discharging device is equipped with the droplet discharging head of Claim 1. As a result, it becomes possible to downsize the apparatus and to realize the droplet discharging device that allows delivery of highly-fine droplets in high quality with a good response to high-speed driving. Moreover, the miniaturization of the apparatus may enhance portability and freedom of installation.

According to a fifth aspect of the invention, a method for manufacturing a droplet discharging head, the head includes: a nozzle substrate having a plurality of nozzle orifices discharging a liquid droplet; cavity substrate having a discharging chamber segmentally provided thereon and communicated with each of the plurality of nozzle orifices, and a bottom wall serving as a vibrating plate; and an electrode substrate having an individual electrode arranged on a first plane thereof so as to oppose the vibrating plate with a predetermined gap. The method includes providing a liquid material supply port to each vibrating plate of the electrode substrate, and providing a reservoir and a communication port communicated with the supply port on a second plane of the electrode substrate the second plane opposing the first plane.

By this manufacturing method, it is possible to obtain a droplet discharging head that may be downsized, highly densely made, and have a greater number of nozzles at the same time.

Additionally, it is preferable that the method further include providing a through electrode used to mount a driver IC on each individual electrode of the electrode substrate.

The area for packaging the driver IC and the wiring portion can be downsized, enabling further miniaturization of the head.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
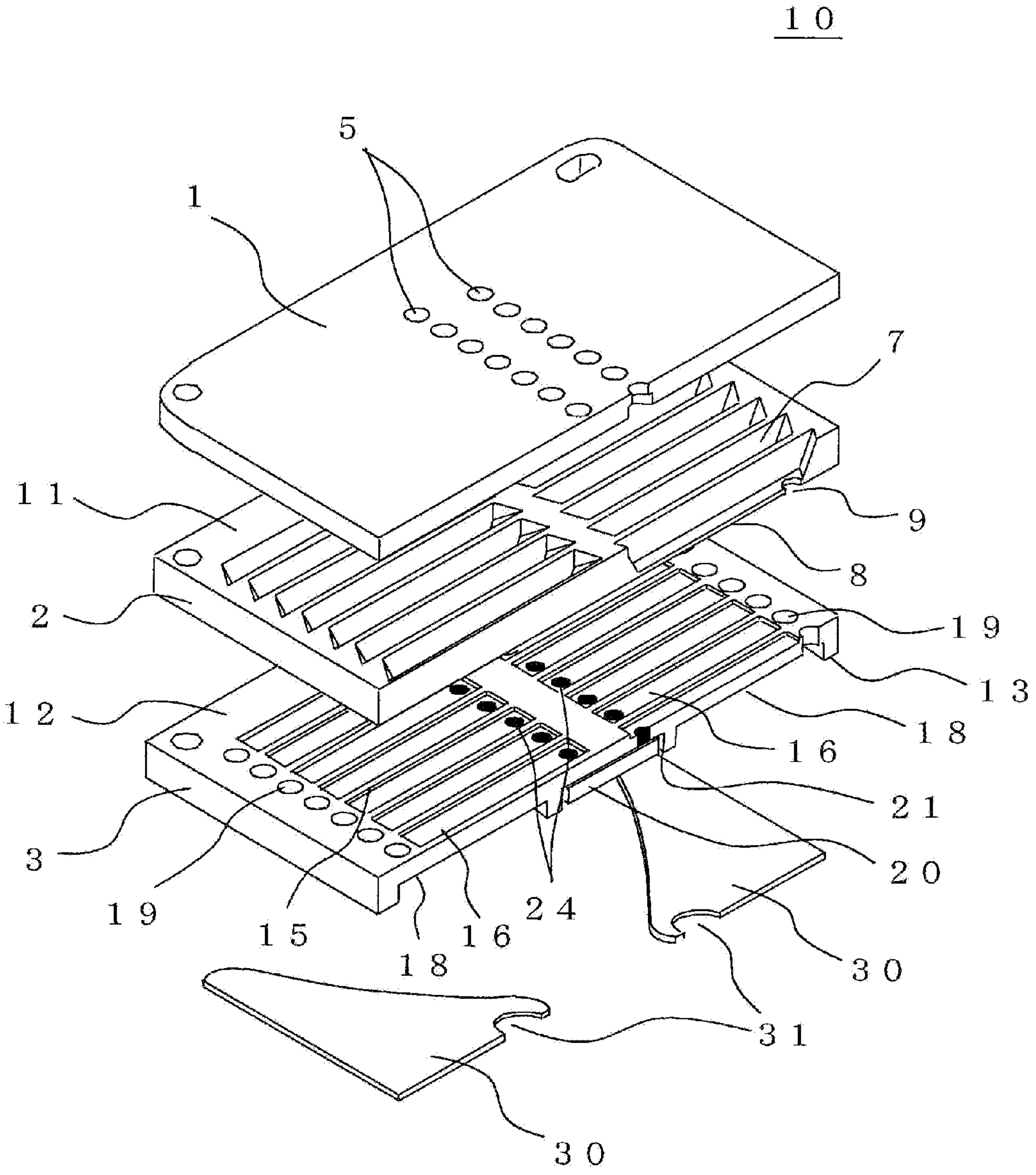
FIG. 1 is an exploded perspective view schematically showing a partial section of the structure of an inkjet head according to a first embodiment of the invention.
Figure 2:
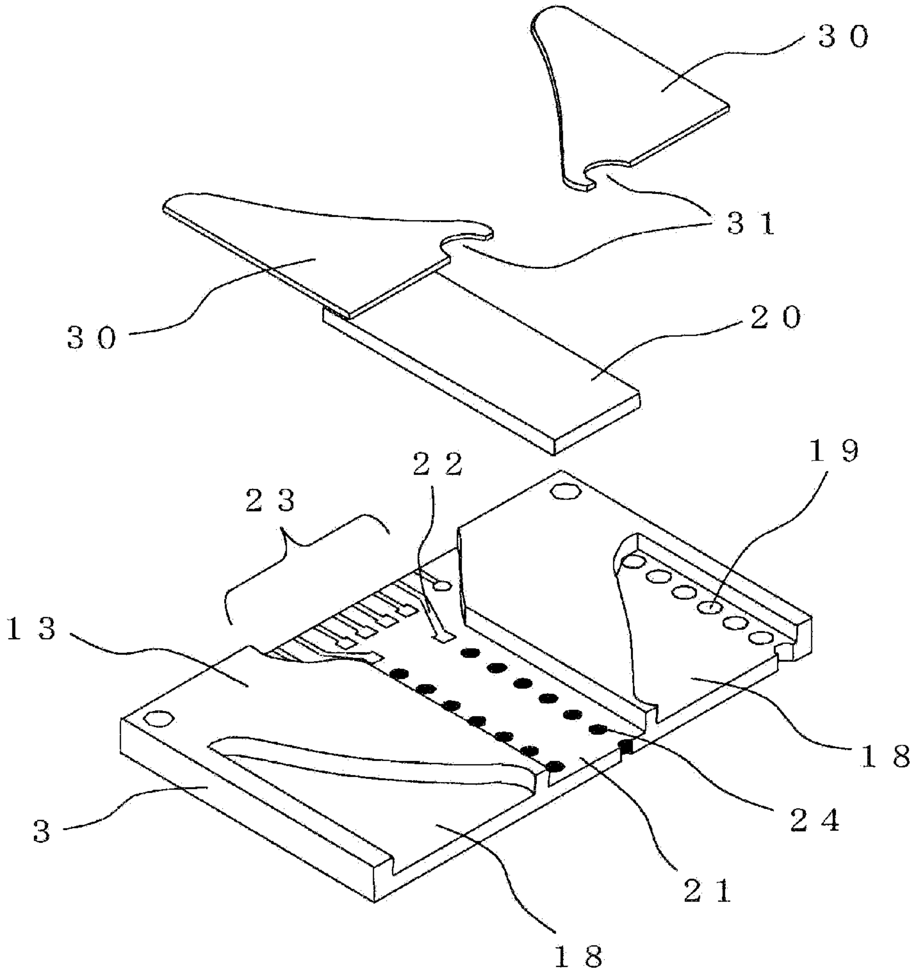
FIG. 2 is an exploded perspective view showing partial sections of an electrode substrate, a driver IC, and a diaphragm of FIG. 1 as shown from the lower surfaces thereof.
Figure 3:
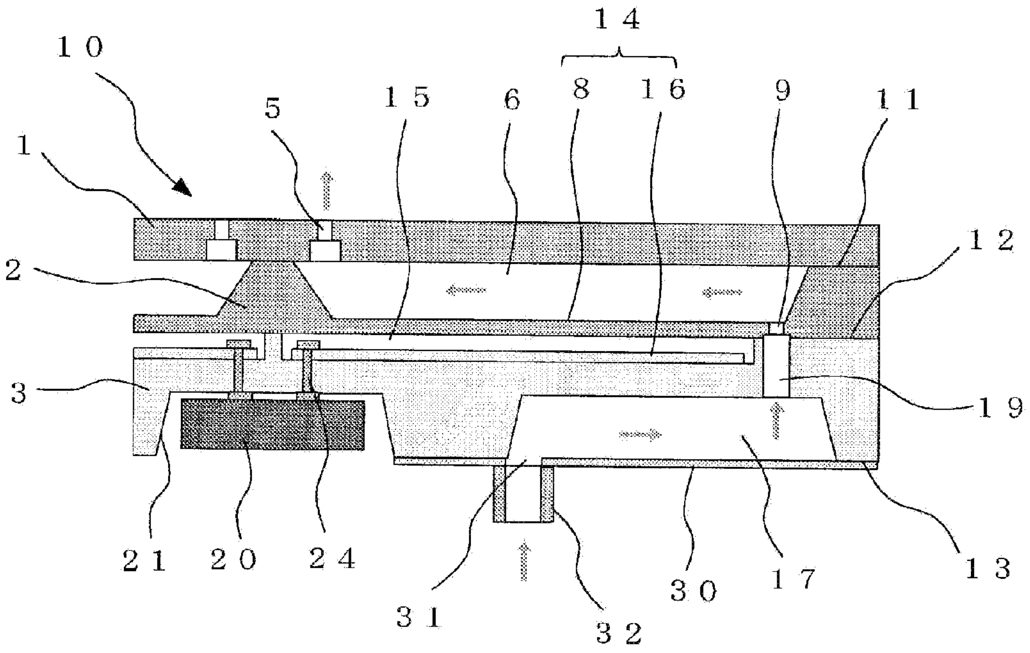
FIG. 3 is a partial section of the inkjet head that has been assembled.

Embodiments of the invention will now be described based on the drawings. With reference to FIGS. 1 to 3, described herein is an inkjet head as an example of the droplet discharging head that uses a face-discharge-type electrostatic drive system and discharges ink droplets from nozzle orifices disposed on the surface of a nozzle substrate. The embodiments of the invention are not limited to the structures and configurations shown in the accompanying drawings but are applicable also to an edge-discharge-type droplet discharging head that discharges ink droplets from nozzle orifices disposed at an end portion of a substrate. In addition, the drive system is also not limited to the electrostatic drive system, but a piezoelectric drive system or a drive system using a heat element is also applicable.

First Embodiment

FIG. 1 is an exploded perspective view schematically showing a partial section of the structure of the inkjet head according to the first embodiment of the invention. FIG. 2 is an exploded perspective view of partial sections of an electrode substrate, a driver IC, and a diaphragm of FIG. 1 as shown from the lower surfaces thereof, showing the configuration of the lower surface of the electrode substrate and the configuration of the drive IC being mounted. FIG. 3 is a partial section of the inkjet head that has been assembled.

Referring to FIGS. 1 through 3, an inkjet head 10 of the first embodiment has a laminate structure having three substrates 1, 2, and 3 attached to each other and is composed as described hereafter. Note that this inkjet head 10 includes two rows of nozzle orifices 5 per each head, but the head may include a single row of nozzle orifices 5. The number of nozzle orifices 5 may also vary.

This inkjet head 10 is composed of a nozzle substrate 1, a cavity substrate 2, and an electrode substrate 3 stacked on top of each other.

The nozzle substrate 1 is made from a single-crystal silicon substrate, for example, and equipped with the plurality of nozzle orifices 5 that discharge ink droplets that 5 are provided by drilling using dry etching.

The cavity substrate 2 is made from a single-crystal silicon substrate having the plane orientation of (110), for example. A discharging chamber formation plane 11 of the substrate 2 includes cavities 7 that are segmented by wet etching, each cavity 7 becoming a discharging chamber 6 communicating with each nozzle orifice 5. The bottom wall of the cavity 7 is highly-accurately composed of an extremely thin boron-diffused layer and acts as a vibrating plate 8 performing out-of-plane deformation. A portion of the vibrating plate 8 includes an ink supply port 9 that is highly-accurately provided by dry etching and communicated with a reservoir 17 which will be described hereafter. A portion joined to the electrode substrate 3 is penetrated to provide the ink supply part 9.

The electrode substrate 3 is made from, e.g., a borosilicate glass substrate. Grooves 15 facing the vibrating plate 8 are segmented by etching and provided on an actuator formation plane (upper plane in FIG. 1) 12 of one surface of this glass substrate. Each groove 15 houses an individual electrode 16. The other surface of the glass substrate having the individual electrodes 16, that is, not the surface having the actuator formation plane 12 but the other surface (lower surface in FIG. 1) of the glass substrate, is a reservoir formation plane 13. On this reservoir formation plane 13, a recess 18 that becomes the reservoir 17, which is a common ink chamber, and a groove 21, which packages a driver IC 20, are provided by sandblasting or wet-etching. Also, referring to FIG. 2, an input wiring section 22 wired to the driver IC 20 and a flexible printed circuit (FPC) packaging terminal (IC input terminal) 22 are provided. The glass substrate also includes through electrodes 24 each conductively coupling the individual electrode 16 on the upper surface of the glass substrate to an output terminal of the driver IC 20 on the lower surface. The reservoir 17 has a relatively large communication port 19 communicated with the ink supply part.

A predetermined gap is provided between the vibrating plate 8 and the individual electrode 16. With an additional insulating film (films) (not shown) interposed between the plate 8 and the electrode 16, the substantial width of the gap is 0.1 μm, for example. The vibrating plate 8 and the individual electrode 16 make up an electrostatic actuator 14. Either one or both of the vibrating plate 8 and the individual electrode 16 includes the insulating film (not shown) for protection from dielectric breakdown or short circuit. A material used for the insulating film is, for example, $SiO_2$, SiN, or a high-k material (gate insulating film with high dielectric constant) such as $Al_2O_3$ or $HfO_2$.

The reservoir 17 communicates with each discharging chamber 6 via the communication port 19 and the ink supply port 9 provided at an end portion of the reservoir 17. A diaphragm 30 made of a thin resin film is bonded and attached onto the reservoir 17 to buffer pressure fluctuation of the reservoir 17. A material used for the diaphragm 30 is, for example, polyphenylene sulfide (PPS), polyolefin, polyimide, or polysulfone. In the first embodiment, PPS having good chemical resistance is used.

The diaphragm 30 includes an ink inlet 31. The ink inlet 31 is adhesively joined to a connecting member 32 that connects the ink inlet 31 to an ink tank (not shown) with an ink supply pipe (not shown) therebetween.

Using an anisotropic conductive adhesive, the driver IC 20 that drives the electrostatic actuator 14 is joined and coupled to the through electrodes 24 and IC input terminals on the glass substrate and is thereby mounted on the glass substrate. A flexible printed circuit (FPC) (not shown) is coupled to the FPC packaging terminal and is electrically connected to external circuitry.

To be coupled to the individual electrodes 16, the through electrodes 24 are formed into electrodes by burying a metal such as copper in through holes made on the glass substrate by, e.g., plating. Coupled to these through electrodes 24 upon packaging of the IC are segment output terminals of the IC.

The FPC packaging terminal is made up of the IC input terminals and a common electrode terminal. The IC input terminals are terminals such as a power supply Vp for driving the electrostatic actuator, a power supply Vcc for driving the IC, a ground potential GND, a clock CLK of a logic system signal, data D1, and a latch LP. The FPC packaging terminal and IC packaging terminals are wired. Also, the common electrode terminal is wired to through-hole electrodes (terminals at both ends of an FPC coupling terminal row 23 shown in part) that are coupled to the cavity substrate 2. In the first embodiment, the common electrode terminal is coupled to the FPC without involving the driver IC 20.

Operations of the inkjet head 10 will now be explained briefly. Ink fills each ink flow passage that stretches from the reservoir 17 provided in the electrode substrate 3 to a tip of the nozzle orifice 5 of the nozzle substrate 1 without making air bubbles, and flows in the directions of arrows shown in FIG. 3.

To perform printing, the driver IC 20 selects nozzles, and when a predetermined pulse voltage is applied between the vibrating plate 8 and the individual electrode 16, an electrostatic force is generated, pulling and bending the vibrating plate 8. The vibrating plate 8 then abuts on the individual electrode 16, thereby generating a negative pressure in the discharging chamber 6. Consequently, the ink in the reservoir 17 is sucked into the discharging chamber 6 via the communication port 19 and the ink supply port 9 and experiences vibration (meniscus vibration). When the ink vibration substantially reaches its maximum, the voltage is removed; the vibrating plate 8 is detached; the ink is pushed out of the nozzle 5 by the recovery force of the plate 8; and ink droplets are discharged onto recording paper (not shown).

The reservoir 17 is composed of, as mentioned above, the diaphragm 30 and the recess 18 made on the glass substrate and attached to each other to close up the reservoir 17. The reservoir 17 supplies ink through the communication port 19 and the ink supply port 9 to each discharging chamber 6. The shape of the recess 18 of the reservoir 17 is a substantial triangle or a substantial trapezoid in flat configuration so that the bubbles that may accumulate and stay between the ink inlet 31 on the diaphragm 30 and the communication port 19 are not generated and that the ink flows at a uniform speed.

Because of thus-formed diaphragm 30 and the reservoir 17 having the configuration and mechanism, the pressure becomes uniform and the ink discharge becomes stable, ensuring stable and high-quality printing with no variation in the amount of discharged ink during the delivery of ink droplets from each nozzle orifice 5.

The inkjet head 10 of the first embodiment includes the discharging chamber 6, the electrostatic actuator 14, and the reservoir 17 each segmented on separate planes and, in addition, has a laminate structure stacking the discharging chamber 6, the actuator 14, and the reservoir 17 in this order in a manner that a projection plane in a direction perpendicular to the formation plane 13 of the reservoir 17 is contained in the formation planes 11, 12 of the discharging chamber 6 and the actuator 14. Accordingly, the inkjet head does not extend in the longitudinal direction, and the reservoir 17 occupying a large area in the segments can be made smaller, thereby downsizing the inkjet head. Also, because the driver IC 20 is packaged in the groove 21 provided on the lower surface of the electrode substrate 3 and not the surface having the individual electrode 16, the packaging area of the wiring and the IC is reduced.

Second Embodiment

Figure 4:
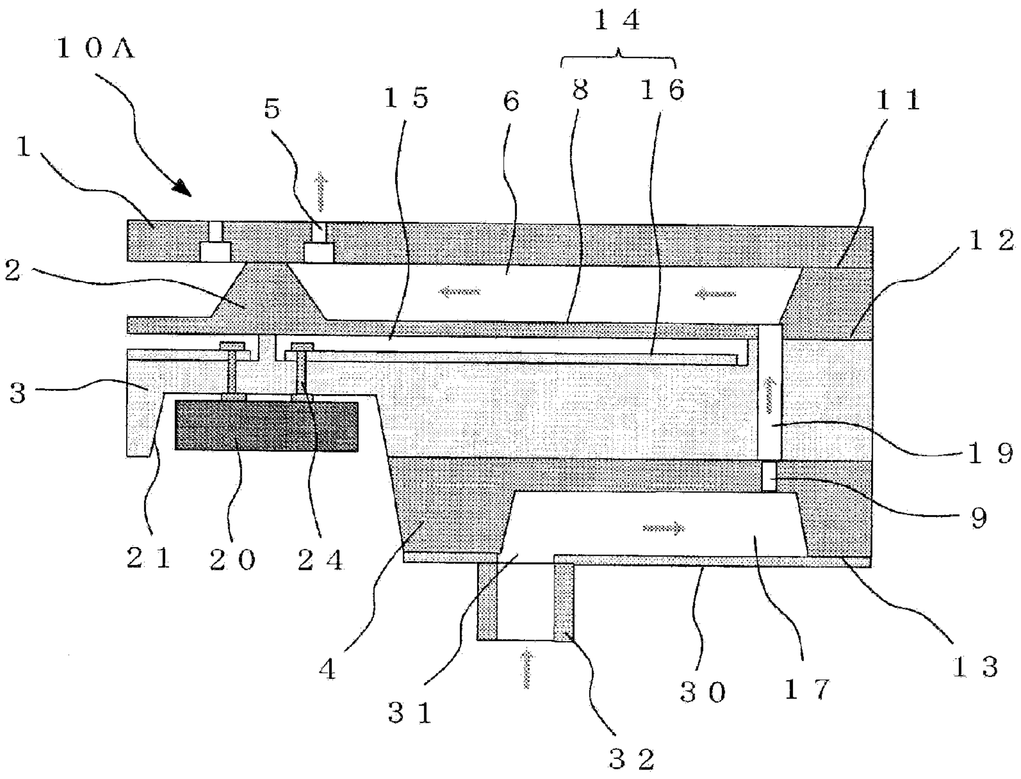
FIG. 4 is a partial section of an inkjet head according to a second embodiment of the invention.

FIG. 4 a sectional diagram of the inkjet head according to the second embodiment of the invention. In the following embodiments, including this second embodiment, elements identical to those of the first embodiment are allotted the same reference numbers, and explanations thereof will not be repeated unless necessary.

An inkjet head 10A of the second embodiment is a laminate structure including the nozzle substrate 1, the cavity substrate 2, the electrode substrate 3, and a reservoir substrate 4. In other words, there are four stacked substrates.

The reservoir substrate 4 includes the ink supply port 9 communicated with each discharging chamber 6 and the reservoir 17 that is the common ink chamber. The reservoir substrate 4 is made from a silicon substrate. A through hole that becomes the ink supply port 9 is made into a hole by groove-machining one surface of the reservoir substrate 4 by means of dry etching. A recess (also referred to as a reservoir groove) that becomes the reservoir 17 is provided by wet etching the other surface, i.e., the reservoir formation plane 13, of the reservoir substrate 4. At this point, the ink supply port 9 is opened and communicated with the reservoir 17.

The reservoir substrate 4 is anodically or adhesively joined to and stacked on the electrode substrate 3. The diaphragm 30 made of a thin resin film is then adhesively joined to the reservoir 17 to close up the reservoir substrate 4. As a result, the ink flow passage containing the common ink chamber, etc. is composed. The communication port 19 is made by penetrating the glass substrate so as to communicate with the ink supply port 9 and, also, to communicate with a through hole in the vibrating plate 8 made from the bottom wall of the discharging chamber 6.

The diaphragm 30 is also equipped with the ink inlet 31 that is adhesively joined to the connecting member 32 for supplying ink. The inkjet head 10A is thus composed.

According to the structure of the second embodiment, the ink supply port 9 that causes flow passage resistance in each ink flow passage can be composed without being influenced by the thickness of the vibrating plate 8. Therefore, the adjustment range of the flow passage resistance is widened, and the precision is increased, enabling more stable and uniform discharge of ink droplets.

Third Embodiment

Figure 5:
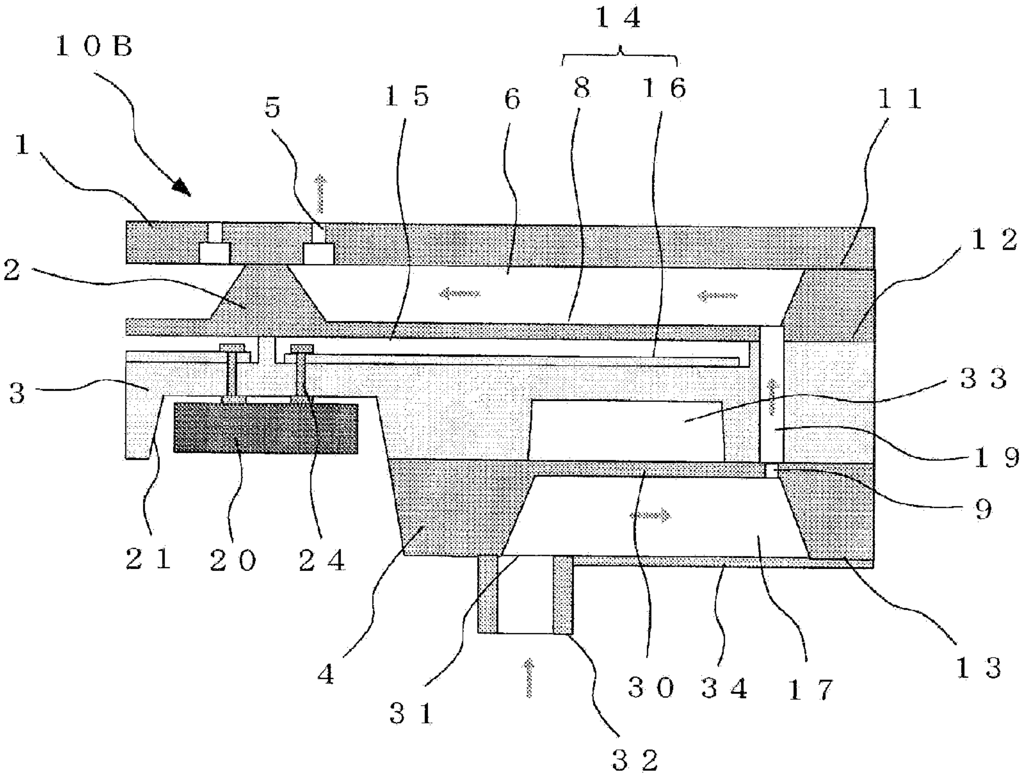
FIG. 5 is a partial section of an inkjet head according to a third embodiment of the invention.

FIG. 5 is a sectional diagram of the inkjet head according to the third embodiment of the invention. Similarly to the four-layered laminate of the second embodiment, an inkjet head 10B of the third embodiment is also composed of a laminate stacking the nozzle substrate 1, the cavity substrate 2, the electrode substrate 3, and the reservoir substrate 4, in this order.

In the third embodiment, unlike the inkjet head 10A of the second embodiment, the bottom wall of the reservoir 17 is composed as the thin film diaphragm 30. Also, a groove that becomes an air chamber 33 is provided on the electrode substrate 3 (glass substrate) on a surface, opposing the bottom wall, of the diaphragm 30 by a process such as sandblasting or wet etching. In addition, a resin lid 34 that includes the ink inlet port 31 and the connecting member 32 is adhesively attached to the reservoir 17.

According to the third embodiment, unlike the inkjet head 10A of the second embodiment, the diaphragm 30 is made of silicon. Therefore, the inkjet head having higher chemical resistance is composed.

Fourth Embodiment

Figure 6:
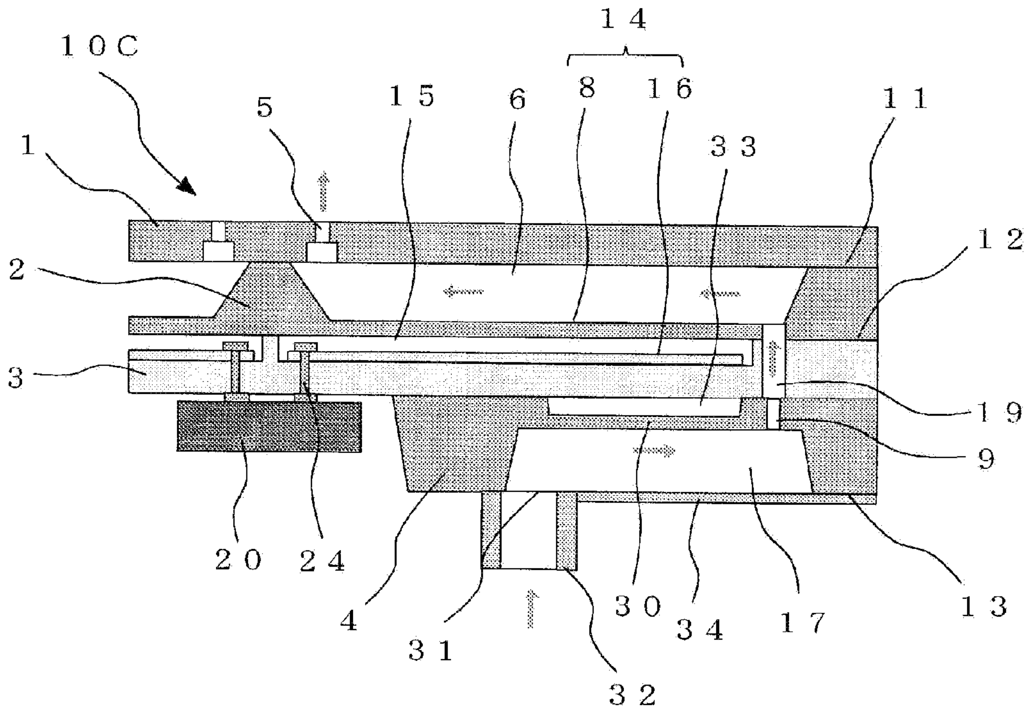
FIG. 6 is a partial section of an inkjet head according to a fourth embodiment of the invention.

FIG. 6 is a sectional diagram of the inkjet head according to the fourth embodiment of the invention. Similarly to the four-layered laminate of the second and third embodiments, an inkjet head 10C of the fourth embodiment is also composed of a laminate stacking the nozzle substrate 1, the cavity substrate 2, the electrode substrate 3, and the reservoir substrate 4, in this order.

In the fourth embodiment, unlike the inkjet head 10B of the third embodiment, the glass substrate that becomes the base of the electrode substrate 3 is made into a thin plate. Then, by dry etching the upper surface of the reservoir 17 located on the side adjacent to the glass substrate, a groove that becomes the air chamber 33 is provided. As a result, the diaphragm 30 made of a thin silicon film is composed.

According to the structure of the fourth embodiment, compared to the structure of the inkjet head 10B of the third embodiment, the flow passage resistance and inertance of the communication port 9 are suppressed, and the responsiveness is increased. Also, because the wiring 23, 22 is provided on the same surface as the lower surface of the electrode substrate 3, the through electrode 24 can be readily provided, and it is possible to more readily produce the electrode substrate 3 and the reservoir substrate 4 and thereby to compose the inkjet head more simply.

Fifth Embodiment

Figure 7:
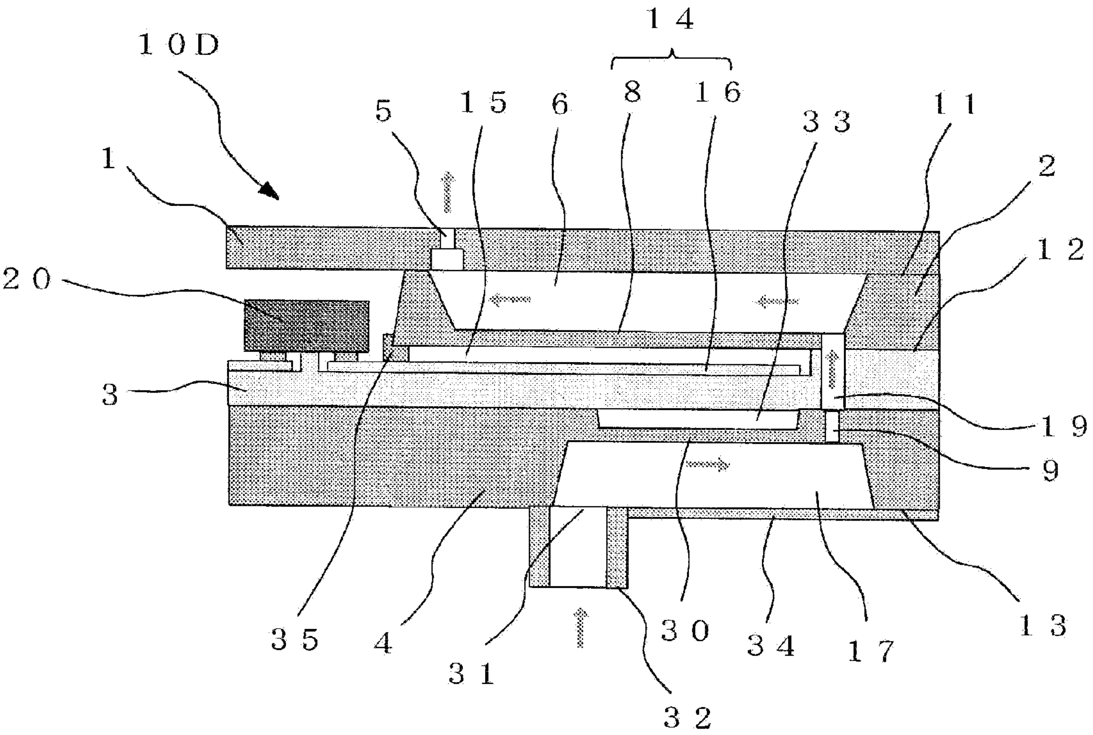
FIG. 7 is a partial section of an inkjet head according to a fifth embodiment of the invention.

FIG. 7 is a sectional diagram of the inkjet head according to the fifth embodiment of the invention. Similarly to the four-layered laminate of the second, third, and fourth embodiments, an inkjet head 10D of the fifth embodiment is also composed of a laminate stacking the nozzle substrate 1, the cavity substrate 2, the electrode substrate 3, and the reservoir substrate 4, in this order.

In the fifth embodiment, unlike the inkjet head of the foregoing embodiments, the driver IC 20 is made thinner than the thickness of the cavity substrate 2 and is packaged on the same plane as the plane having the individual electrode 16. Also, an open end of the gap formed between the vibrating plate 8 and the individual electrode 16 making up the electrostatic actuator 14 is sealed airtight with an adhesive made from an ultraviolet (UV)-curing type or thermal-curing type epoxy resin or a sealant 35 made of an inorganic material such as silicon oxide or alumina by plasma chemical vapor deposition (CVD).

According to the structure of the fifth embodiment, the driver IC 20 is packaged on the same plane as the formation plane of the electrostatic actuator 14, without providing the through electrodes 24. Therefore, the electrode substrate 3 is fabricated more simply.

In some other embodiments, the packaging configuration and the structure of the driver IC 20 may be combined with the structure of the reservoir 17 so as to be most suited for the purposes when composing the inkjet head and the inkjet head recording apparatus loading the inkjet head. Since the packaging plane of the driver IC, or the common ink chamber, is segmented and stacked on a plane different from the plane of the ink flow passage and the actuator, it is possible that the inkjet head of any of the embodiments of the invention be highly densely made, downsized, and have a greater number of nozzles at the same time.

Moreover, according to the inkjet head of the embodiments of the invention, it is possible that the coupling to the driver IC and the connection of a piping member to the ink flow passage be done directly from the plane on the other side of the ink-droplet discharging plane. Accordingly, the inkjet head can be installed in the recording apparatus at a higher degree of freedom, the recording apparatus is further downsized, and the speed of printing becomes faster at the same time.

Figure 8:
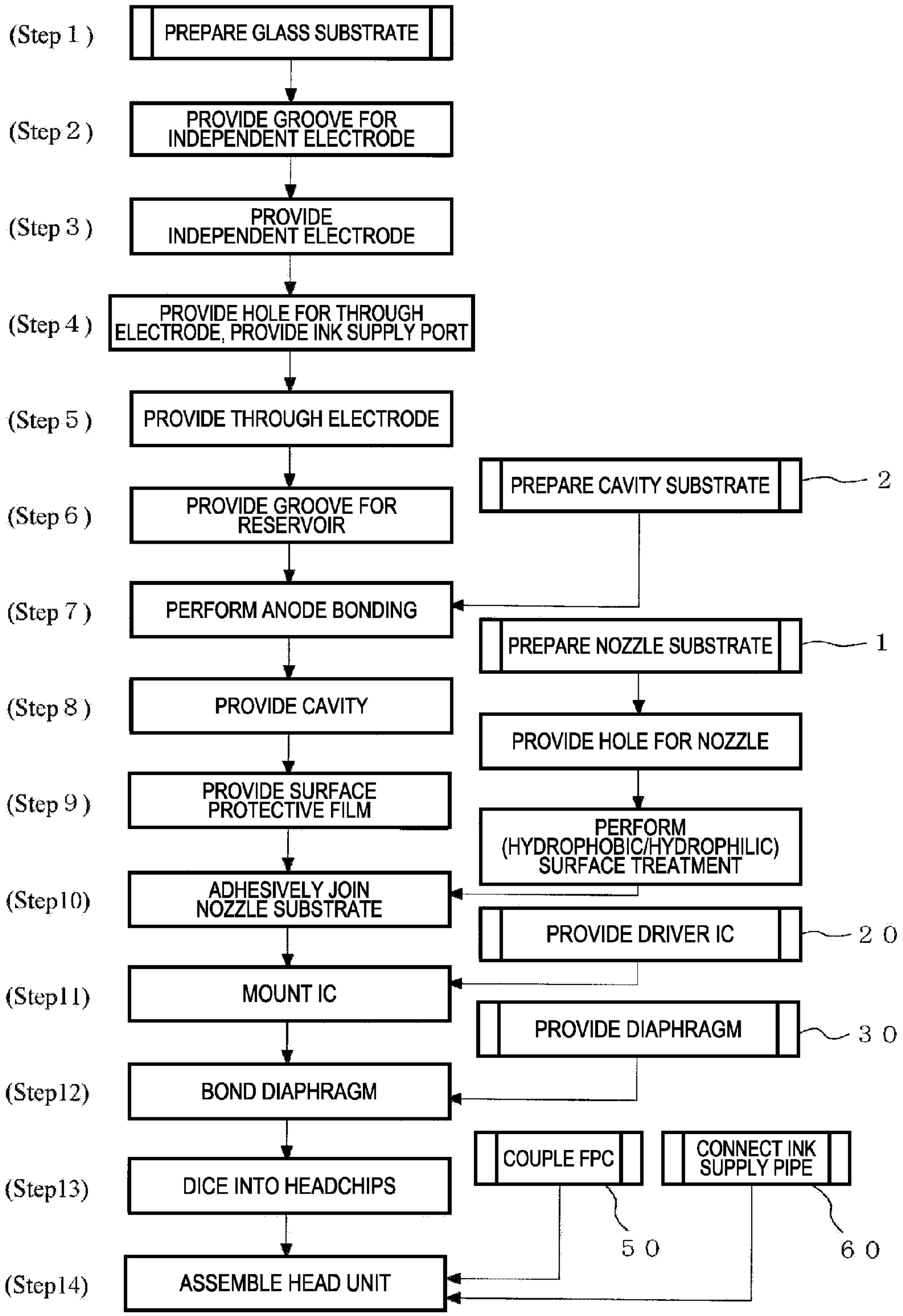
FIG. 8 is a flow chart showing an exemplary process of manufacturing the inkjet head of some embodiments of the invention.

The method for manufacturing the inkjet head of some embodiments of the invention will now be briefly described with reference to FIG. 8. FIG. 8 is a flow chart showing an exemplary process of manufacturing the inkjet head of some embodiments of the invention. Mainly, the manufacturing method of the inkjet head of the first embodiment will be described (see FIGS. 1 to 3). The other embodiments can be manufactured by following the same process.

Step 1: A glass substrate having a thickness of about 1 mm is prepared, and both surfaces thereof are polished.

Step 2: Grooves for the individual electrodes are formed in a desired depth by etching one surface of the glass substrate with hydrofluoric acid using an etching mask of gold/chromium.

Step 3: An indium tin oxide (ITO) film having a thickness of 100 nm is provided, for example, by sputtering on the entire surface of the glass substrate having the grooves described above. Thereafter, this ITO film is resist-patterned by photolithography, and a portion other than a portion for the individual electrodes is etched and removed, thereby producing the individual electrodes 16 inside the grooves.

Step 4: Only a portion of holes for the through electrodes and a portion for the communication hole of the ink supply port are formed by resist-patterning using photolithography. By dry etching, the holes are processed so as to have desired depths. Processing of grooves for IC input wiring sections is also conducted at the same time.

Step 5: The holes for the through electrodes and the grooves of the IC input wiring sections are resist-patterned, and a metal such as copper is buried by, e.g., electroless plating to produce the through electrodes 24.

Step 6: A dry film, e.g., is applied on the lower surface of the glass substrate opposite the surface having the individual electrode, followed by patterning of a portion of the reservoir and the IC packaging section. The recess for the reservoir 17 and the grooves for the IC packaging section are then provided by sandblasting. Also, the IC input terminals 23 and the IC input wiring sections 22 are provided by, e.g., sputtering a metal such as gold.

Through the foregoing steps, the electrode substrate 3 in a form of wafer is fabricated.

Step 7: A silicon substrate that becomes the base of the cavity substrate 2 is prepared in a thickness of, e.g., 280 μm. A portion of the hole that becomes the ink supply port on the bottom surface of each cavity is resist-patterned. The resultant is dry etched to produce the hole for the ink supply port 9. The hole is then anodically joined to the surface of the electrode substrate 3 having the individual electrodes.

Step 8: The anodically-joined silicon substrate is polished down to a thickness of about 30 μm. Thereafter, the surface of the silicon substrate is resist-patterned by anisotropic wet etching to form the cavity for the discharging chamber 6. Further, the portion of the hole that becomes the ink supply port at the bottom surface of each cavity is opened and penetrated to produce the hole that becomes the ink supply port.

Step 9: A surface protective film (ink-proof protective film) made of a $SiO_2$ film is provided on the surface of the silicon substrate having the above-produced ink supply port 9 in each cavity by CVD using tetraethoxysilane (TEOS) as a gaseous material.

Through the steps above, the cavity substrate 2 is fabricated out of the silicon substrate joined anodically to the electrode substrate 3 that is prepared in advance.

Step 10: The nozzle substrate 1 is adhesively joined onto the surface of the above-produced cavity substrate 2. The nozzle substrate 1 is manufactured through a separate process, in which the nozzle orifices 5 of the same number and pitch as that of the cavities are provided using, e.g., a silicon substrate in a thickness of 50 μm and are then subjected to surface treatment.

Step 11: After joining the nozzle substrate 1, the driver IC 20 that is a chip is mounted on the electrode substrate 3.

Step 12: The diaphragm 30 is then adhesively joined onto the reservoir 17. Then, the connecting member 32 is also adhesively joined to the ink inlet 31 of the diaphragm 30.

Step 13: By dicing, a plurality of separated head chips are produced.

Step 14: Finally, an FPC 50 is electrically coupled to each of the head chips using a conductive adhesive, and an ink supply pipe 60 connected to an ink tank is connected to the connecting member 32.

As a result, the inkjet head is assembled.

In the manufacture of the reservoir substrate 4 as shown in the second to fifth embodiments, a silicon substrate in a thickness of 525 μm is used, for example. After patterning one surface of the substrate, the hole that becomes the ink supply port is provided by dry etching. After patterning the other surface, the recess that becomes the reservoir is provided by wet etching. The ink supply port is thereby penetrated.

Thus-produced reservoir substrate 4 is either anodically or adhesively joined to the electrode substrate 3, before being adhesively joined to the nozzle substrate 1 of step 10. If bonding, instead, the reservoir substrate 4 may be bonded after being bonded to the nozzle substrate 1.

Figure 9:
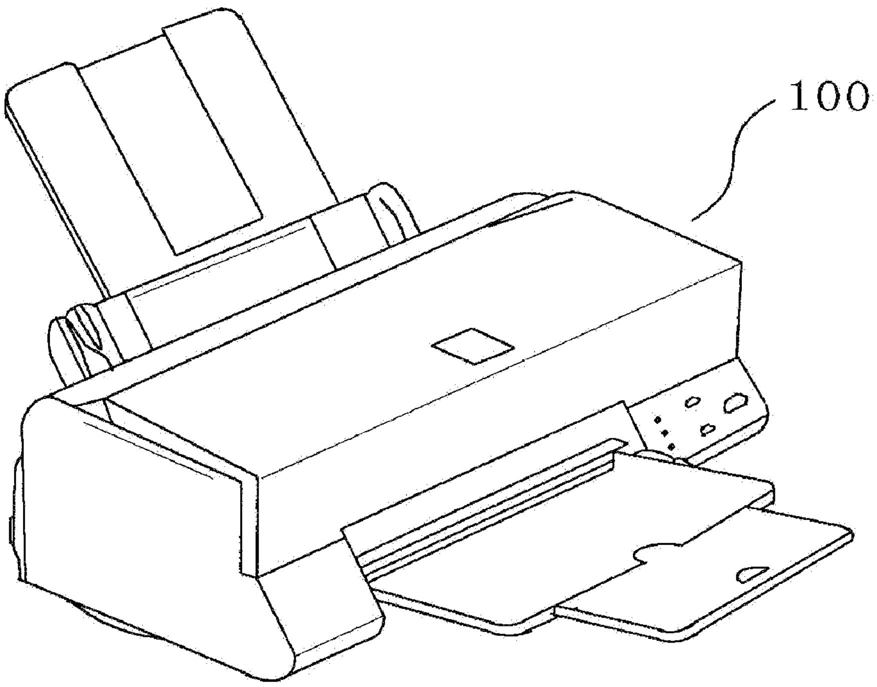
FIG. 9 is a perspective diagram schematically showing an example of an inkjet printer employing the inkjet head of some embodiments of the invention.

In the embodiments hereinbefore, the inkjet head and its manufacturing method are described. However, the invention is not limited to these embodiments but may be modified in a variety of ways within the scope of the ideas of the invention. For example, the electrostatic actuator in the embodiments of the invention may also be used in devices such as an optical switch, a mirror device, a micropump, and a drive of a laser operation mirror of a laser printer. Moreover, in addition to an inkjet printer 100 shown in FIG. 9, the inkjet head may be used as the droplet discharging device with various applications by changing the liquid materials discharged from the nozzle orifices, such as for the manufacture of color filters of liquid crystal displays, formation of light-emitting portions of organic electroluminescence (EL) displays, and for the manufacture of microarrays of biomolecule solutions used for, e.g., genetic testing.

What is claimed is:

1. A droplet discharging head, comprising:

a plurality of discharging chambers, each of the plurality of discharging chambers having a chamber bottom wall and first and second chamber side edges;

a plurality of nozzle orifices discharging droplets and each of the plurality of nozzle orifices is communicated with one of the discharging chambers, the plurality of nozzle orifices are formed in a nozzle substrate;

a plurality of actuators, each of the plurality of actuators including:

a vibrating plate constituted by the chamber bottom wall which is drivably displaceable; and a reservoir commonly communicated with each of the plurality of discharging chambers, the reservoir having a reservoir bottom wall and first and second reservoir side edges, wherein the plurality of nozzle orifices, the first chamber side edge and the first reservoir side edge are located near a center of the nozzle substrate, and the second chamber side edge and the second reservoir side edge are located near an edge of the nozzle substrate, the plurality of discharging chambers, the plurality of actuators, and the reservoir are each segmented on separate planes and stacked in this order so that the plurality of discharging chambers, the plurality of actuators, and the reservoir are vertically aligned in a direction perpendicular to the reservoir bottom wall, the first reservoir side edge of the reservoir is overlapped by the plurality of discharging chambers and the plurality of actuators, the plurality of nozzle orifices are located near the first chamber side edge, the first chamber side edge is angled relative to a droplet discharging direction in which the droplets are discharged from the plurality of nozzle orifices, the plurality of nozzle orifices and the first chamber side edge are vertically aligned in the droplet discharging direction, a first ink flow direction in the reservoir is from the first reservoir side edge toward the second reservoir side edge, the first ink flow direction is perpendicular to the droplet discharging direction, and a second ink flow direction in each of the plurality of discharging chambers is from the second chamber side edge toward the first chamber side edge, the second ink flow direction is opposite to the first ink flow direction.

2. The droplet discharging head according to claim 1, wherein the plurality of the actuators are provided on a first surface of a first substrate, and the reservoir is provided in a second surface of the first substrate, the second surface being opposite to the first surface.

3. The droplet discharging head according to claim 1, further comprising a liquid material supply port communicated with each of the reservoir and the plurality of discharging chambers, wherein the liquid material supply port is provided in the vibrating plate.

4. The droplet discharging head according to claim 3, further comprising a second substrate provided on the second surface of the first substrate, the reservoir and the liquid material supply port being provided in the second substrate.

5. The droplet discharging head according to claim 4, wherein the reservoir bottom wall of the reservoir in the second substrate is a diaphragm.

6. The droplet discharging head according to claim 5, further comprising an air chamber provided adjacent to the reservoir and opposite to the reservoir bottom wall.

7. The droplet discharging head according to claim 2, further comprising:

a driver integrated circuit (IC) that is electrically connected to the plurality of actuators and mounted on one of the first and second surfaces of the first substrate.

8. The droplet discharging head according to claim 1, each of the plurality of actuators being an electrostatic drive mechanism.

9. A droplet discharging head, comprising:

a nozzle substrate having a plurality of nozzle orifices discharging a liquid droplet;

a cavity substrate including:

a discharging chamber segmentally provided therein and communicated with each of the plurality of nozzle orifices, the discharging chamber having first and second chamber side edges; and a cavity bottom wall serving as a vibrating plate;

an electrode substrate having an individual electrode arranged on a first plane thereof so as to oppose the vibrating plate across a predetermined gap; and a reservoir substrate having a reservoir communicated with the discharging chamber, the reservoir having a reservoir bottom wall and first and second reservoir side edges, wherein the plurality of nozzle orifices, the first chamber side edge and the first reservoir side edge are located near a center of the nozzle substrate, and the second chamber side edge and the second reservoir side edge are located near an edge of the nozzle substrate, the reservoir substrate is stacked on a second plane of the electrode substrate, the second plane opposing the first plane, the first reservoir side edges of the reservoir is overlapped by the discharging chamber and the vibrating plate, the plurality of nozzle orifices are located near the first chamber side edge, the first chamber side edge is angled relative to a droplet discharging direction in which the liquid droplet is discharged from the plurality of nozzle orifices, the plurality of nozzle orifices and the first chamber side edge are vertically aligned in the droplet discharging direction, a first ink flow direction in the reservoir is from the first reservoir side edge toward the second reservoir side edge, the first ink flow direction is perpendicular to the droplet discharging direction, and a second ink flow direction in each of the plurality of discharging chambers is from the second chamber side edge toward the first chamber side edge, the second ink flow direction is opposite to the first ink flow direction.

10. A droplet discharging device equipped with the droplet discharging head according to claim 1.

11. A method for manufacturing a droplet discharging head including: a nozzle substrate having a plurality of nozzle orifices discharging a liquid droplet; a cavity substrate having a discharging chamber segmentally provided therein and communicated with each of the plurality of nozzle orifices, and a cavity bottom wall serving as a vibrating plate; and an electrode substrate having an individual electrode arranged on a first plane thereof so as to oppose the vibrating plate across a predetermined gap, the method comprising:

providing a liquid material supply port in the vibrating plate of the electrode substrate; and providing a reservoir and a communication port communicated with the supply port on a second plane of the electrode substrate, the second plane opposing the first plane, wherein the reservoir has a reservoir bottom wall and first and second reservoir side edges, the discharging chamber, the vibrating plate, and the reservoir are vertically aligned with each other in a direction perpendicular to the reservoir bottom wall, the first reservoir side edge of the reservoir is overlapped by the discharging chamber and the vibrating plate, the discharging chamber has first and second chamber side edges, the plurality of nozzle orifices, the first chamber side edge and the first reservoir side edge are located near a center of the nozzle substrate, and the second chamber side edge and the second reservoir side edge are located near an edge of the nozzle substrate, the plurality of nozzle orifices are located near the first chamber side edge, the first chamber side edge is angled relative to a droplet discharging direction in which the liquid droplet is discharged from the plurality of nozzle orifices, the plurality of nozzle orifices and the first chamber side edge are vertically aligned in the droplet discharging direction, a first ink flow direction in the reservoir is from the first reservoir side edge toward the second reservoir side edge, the first ink flow direction is perpendicular to the droplet discharging direction, and a second ink flow direction in each of the plurality of discharging chambers is from the second chamber side edge toward the first chamber side edge, the second ink flow direction is opposite to the first ink flow direction.

12. The method for manufacturing a droplet discharging head according to claim 11, further comprising providing a through electrode used to mount a driver IC on the individual electrode of the electrode substrate.

13. A droplet discharging head, comprising:

a nozzle substrate having a plurality of nozzle orifices discharging a liquid droplet;

a cavity substrate including:

a discharging chamber segmentally provided therein and communicated with each of the plurality of nozzle orifices, the discharging chamber having first and second chamber side edges; and a cavity bottom wall serving as a vibrating plate;

an electrode substrate having an individual electrode arranged on a first plane thereof so as to oppose the vibrating plate across a predetermined gap; and a reservoir substrate having a reservoir communicated with the discharging chamber, the reservoir having a reservoir bottom wall first and second reservoir side edges, wherein the plurality of nozzle orifices, the first chamber side edge and the first reservoir side edge are located near a center of the nozzle substrate, and the second chamber side edge and the second reservoir side edge are located near an edge of the nozzle substrate, the reservoir substrate is stacked on a second plane of the electrode substrate, the second plane opposing the first plane, the reservoir bottom wall is a diaphragm, the plurality of nozzle orifices are located near the first chamber side edge, the first chamber side edge is angled relative to a droplet discharging direction in which the liquid droplet is discharged from the plurality of nozzle orifices, the plurality of nozzle orifices and the first chamber side edge are vertically aligned in the droplet discharging direction, a first ink flow direction in the reservoir is from the first reservoir side edge toward the second reservoir side edge, the first ink flow direction is perpendicular to the droplet discharging direction, and a second ink flow direction in each of the plurality of discharging chambers is from the second chamber side edge toward the first chamber side edge, the second ink flow direction is opposite to the first ink flow direction.

* * * * *